United States Patent [19]

Logan

[11] Patent Number: 4,791,363
[45] Date of Patent: Dec. 13, 1988

[54] CERAMIC MICROSTRIP PROBE BLADE

[76] Inventor: John K. Logan, 26527 Silver Spur Rd., Rancho Palos Verdes, Calif. 90274

[21] Appl. No.: 101,669

[22] Filed: Sep. 28, 1987

[51] Int. Cl.$^4$ .................... G01R 1/067; G01R 19/145
[52] U.S. Cl. ............................... 324/158 P; 324/72.5; 324/158 F; 333/246
[58] Field of Search ............... 324/73 PC, 725, 158 P, 324/158 F; 333/246

[56] References Cited

U.S. PATENT DOCUMENTS

| | | |
|---|---|---|
| 3,560,907 | 2/1971 | Heller . |
| 4,116,523 | 9/1978 | Coberly et al. ................ 324/158 P |
| 4,161,692 | 7/1979 | Tarzwell . |
| 4,195,259 | 3/1980 | Reid et al. . |
| 4,423,373 | 12/1983 | Le Croy, Jr. . |
| 4,593,243 | 6/1986 | Lao et al. ........................ 324/158 F |
| 4,731,577 | 3/1988 | Logan .............................. 324/158 P |
| 4,749,942 | 6/1988 | Sang et al. ...................... 324/158 F |

Primary Examiner—Reinhard J. Eisenzopf
Assistant Examiner—W. Burns
Attorney, Agent, or Firm—Gordon K. Anderson

[57] ABSTRACT

A microstrip probe blade which has a ceramic body (20) with a microstrip (26) on one side and a metalized ground plane (30) on the other. A straight needle (32) having a tapered end and a spherical tip is attached to the microstrip axially and protrudes from the body parallel to the microstrip such that a high frequency signal may be conducted through the device with a minimum of electrical aberations. With this blade test, frequencies as high as 10 gigahertz may be achieved overcoming previous frequency limitations. The probe blade by virtue of the ground plane (30) wrapping around slightly to the microstrip side of the body (20) allows the addition of resistors (36) or chip capacitors (38) to minimize electrical spikes, transients, and unwanted opscillations to power supply frequencies.

16 Claims, 2 Drawing Sheets

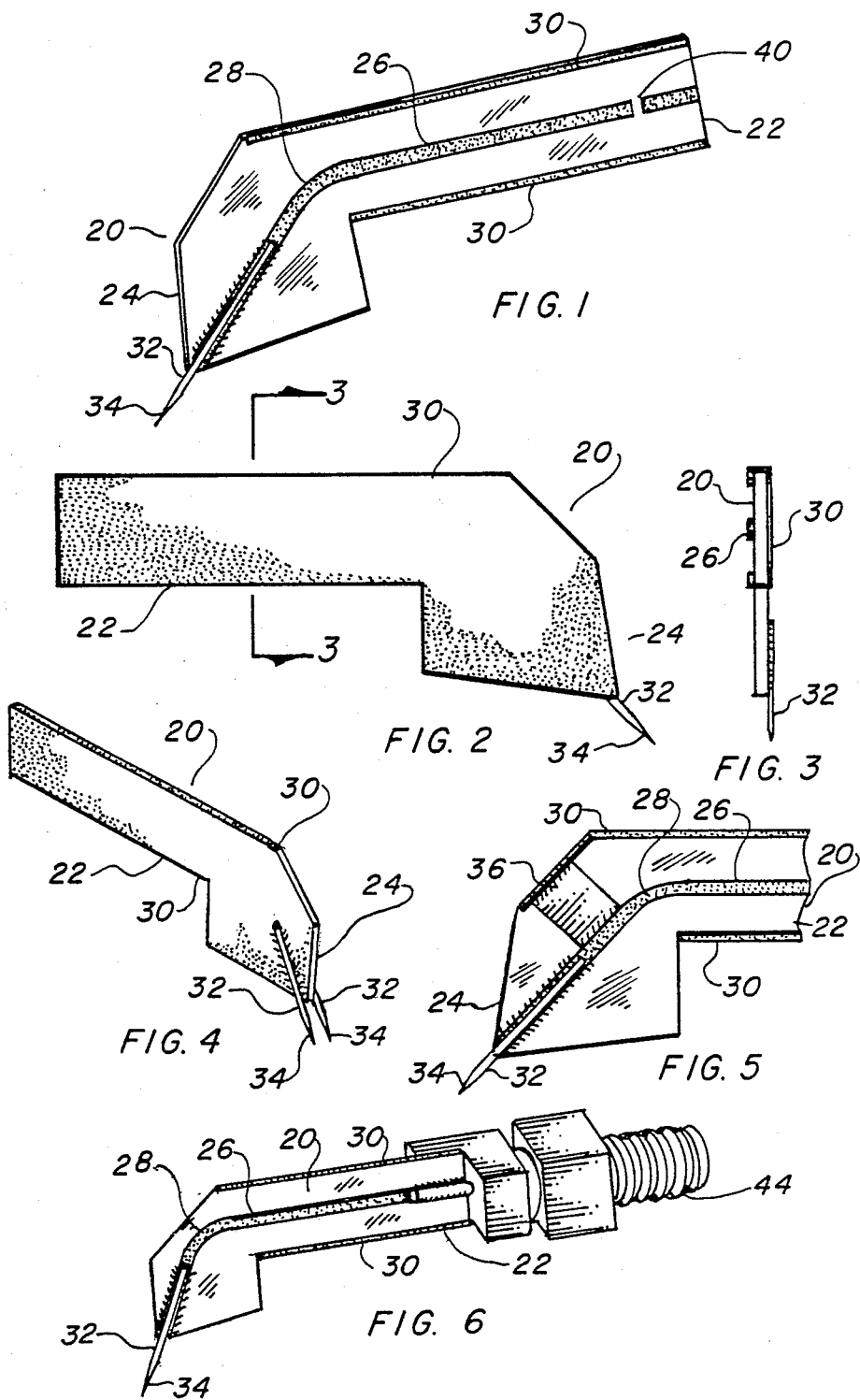

CERAMIC MICROSTRIP PROBE BLADE

TECHNICAL FIELD

The present invention relates to devices associated with electrical test measurement using high frequency signals in general, and more specifically to a ceramic microstrip probe blade for silicon or gallium arsenide chip continuity testing at speeds up to 10 gigahertz.

BACKGROUND ART

Ceramic blades for probing small pads in close proximity have been known and are in common use, however, due to inherent limitations the ability to reach frequencies above 2 gigahertz has not been achieved by prior art. Basically, this limitation is due to the geometry and method of attachment of the needle onto the blade and its physical orientation. Many types of blades have been employed in attempting to solve the problems of high frequency probing while allowing an acceptable contact force and compliance without distorting the signal with undue insertion or return loss. A search of the prior art did not disclose any patents that read directly on the claims of the instant invention, however, the following U.S. patents were considered related:

| U.S. Pat. No. | Inventor | Issue Date |
| --- | --- | --- |
| 3,560,907 | Heller | Feb. 2, 1971 |
| 4,161,692 | Tarzwell | Jul. 17, 1979 |
| 4,195,259 | Reid et al | Mar. 25, 1980 |
| 4,423,373 | LeCroy, Jr. | Dec. 27, 1983 |

P. V. N. Heller teaches an arrangement whereby a plurality of individual flexing arms are apportioned in a circular array. The flexing arms are spring loaded to provide resiliency with wire leads connected on the outside periphery of the enclosure to terminal posts for transmitting the electrical signal. The contact point that is contiguous with the workpiece is integrally formed with the connector contact which engages a prescribed point in the circuit, thereby permitting the conducting of measuring circuit response by external equipment.

Tarzwell uses an "L" shaped ceramic support member having an elongated end with a thin metalized portion along the narrow edge surface to which a bent needle is attached by soldering. The needle is parallel to the ceramic member and curved downward. The tip of the needle is sanded flat to produce a surface parallel to the support member. In one embodiment, metalized portions are positioned parallel on the side of the support member to provide a power and signal path for the test equipment signal.

While a needle is attached to a metalized portion on the edge or the side of Tarzwell's invention, the needle is always parallel and bent downward near the tip. This is true of some commercially available probe blades that are in common use today and employ some of the features as taught by Tarzwell. An example of this type of probe blade is the series ACS manufactured by Wentworth Laboratories, Inc., or type 301 produced by Cerprobe of Tempe, Ariz.

Reid et al uses an "L" shaped extension arm that is adjustable in angular displacement with a support sleeve retaining a probe tip in the form of a needle with a downwardly depending end. A force sensitive material is attached to the arm of the probe detector device and is bordered by silver plated regions with wires soldered to the plates.

LeCroy, Jr. utilizes a test probe having two substantially rigid electrically conducting members which are insulated from each other. This probe embodiment is for background purposes as indicative of the art to which the invention relates.

It may be seen that overall system low frequency probing has been the main thrust of the above inventions and the art has approached the elevated frequency problem with little regard to minimize the insertion and return losses on the probes themself.

DISCLOSURE OF THE INVENTION

The state of the art is rapidly changing as far as the material and construction of microelectronic wafers is concerned. There is much activity in the development of gallium arsenide analogs of silicon digital integrated circuits for use in computers. This material is similar in application to the more conventional silicon chip, but permits the passage of much higher frequency signals. One of the basic steps in semiconductor wafer manufacturing is a so-called "wafer probe", in which each of several hundred patterns on the wafer must be contacted with a probe card for circuit testing. When gallium arsenide devices are wafer probed "at speed" it is then necessary that the probe card assembly, including its individual probe, be capable of handling frequency signals from 2 to 5 gigahertz (GHz). Conventional state of the art "DC", or low frequency probe cards are rendered useless for probing these high frequencies, because of their long unshielded metal runs, and metal blades or needle probes.

The use of ceramic blade probes is an attempt by industry to achieve the higher frequency operation, however, two major deficiencies still exist. First, the blade utilizes a microstrip on one side that terminates at the bottom of the blade, and a bent needle is attached at right angles to the microstrip. This abrupt change in direction of the flowpath creates discontinuities and standing waves in the high frequency signal that creates unnecessary losses and distortions that limit achieving the higher frequencies. Secondly, the ability to create a short ground loop, or flowpath, from the signal pad to the ground pad on the semiconductor device under test is unobtainable at the frequencies necessary. While it is physically possible to make the attachment of a ground needle to the ceramic blade, the needle, by virtue of its configuration, is excessively protracted. This extends the ground loop, thereby limiting the achievable frequency potential.

It is, therefore, a primary object of the invention to overcome these obstacles allowing a signal of up to 10 gigahertz (GHz) to be conducted through a ceramic microstrip probe blade without undue electrical aberations. This ability is accomplished by using a microstrip oriented angularly through a gradual radial bend to a straight needle attached axially to the microstrip in linear orientation. This arrangement provides a smooth uniform unobstructed path through the probe. Actual tests have recorded a maximum insertion loss of 2 decibels (db) at 10 gigahertz (GHz), which indicates acceptable performance at this high frequency level. The same test also produced similar results with respect to the return losses which act much like an echo reflection that may obscure the test signal. In order to achieve these results, the needle has limited protrusion, that is, the length that the probe needle projects from the blade, which is still sufficient to allow an acceptable spring constant permitting compliance with the tip of the needle onto the delicate pad of the test point of the microchip.

An important object of the invention further provides a ground loop considerably shorter than previously achievable. This is accomplished by attaching a ground needle to the ground plane immediately opposite that of the signal needle. Since the protrusion is very small, such as 0.075 inches (1.905 mm), the ground loop is just double that amount, considerably reducing the length over any prior art yet devised.

Another object of the invention allows the choice of accommodation of the position of the ground pad relative to the signal pad on the microelectronic device under test. This is accomplished using a right or left hand blade, with the microstrip located on one or other side, and the ground plane metalized surface situated oppositely.

Still another object of the invention is directed to the ease in which an edge launch high frequency connector may be attached directly to the blade. A conventional threaded microwave connector may be attached immediately to the rear termination point of both the microstrip and the ground plane. This brings the electronic discontinuities to a minimum, as even the direct mechanical attachment of a coaxial cable creates some signal losses and reflections that the connector abrogates.

Yet another object of the invention allows the accommodation of varied thickness of ceramic material for the body. The width of the microstrip in relation to the thickness of the body determines the electrical impedance, therefore, the characteristic may be easily changed by simply varying the material thickness and maintaining the relative proportion.

A further object of the invention permits the angle of the needle in relation to the horizontal run of the microstrip to be arranged at an angle to provide either greater or lesser flexibility of the needle. Inasmuch as extremely short needles are an optimum expedient to accomplish this task the angle at which the needle approaches the pad becomes critical. An angle of from 30 to 60 degrees has been proven to be adequate with a 45 degree angle optimum. At these angles compliance is still provided, even with the very short probe needle length. This allows the bending of the needle to occur to compensate for the difference of out of plane conditions that occur on the pads of the semiconductor device. These pads are very delicate and may be as thin as 500 angstroms and are subject to punch through. The instant invention with the angled needle overcomes this problem allowing compliance on all the pads without any detrimental effect while still allowing an extremely high frequency signal to be employed.

These and other objects and advantages of the present invention will become apparent from the subsequent detailed description of the preferred embodiment and the appended claims taken in conjunction with the accompanying drawings.

BRIEF DESCRIPTION OF THE DRAWINGS

FIG. 1 is a side elevational view of the preferred embodiment illustrating the microstrip side of the blade.

FIG. 2 is a side elevational view of the preferred embodiment illustrating the ground plane side of the blade.

FIG. 3 is a cross-sectional view taken along lines 3—3 of FIG. 2.

FIG. 4 is an isometric view of the second embodiment illustrating the relationship of the pair of needles forming a ground loop probe.

FIG. 5 is a side elevational view of the preferred embodiment with a resistor soldered between the microstrip and the ground plane.

FIG. 6 is a partial isometric view of the preferred embodiment with an SMA high frequency connector attached at the end.

BEST MODE FOR CARRYING OUT THE INVENTION

Figure 7:
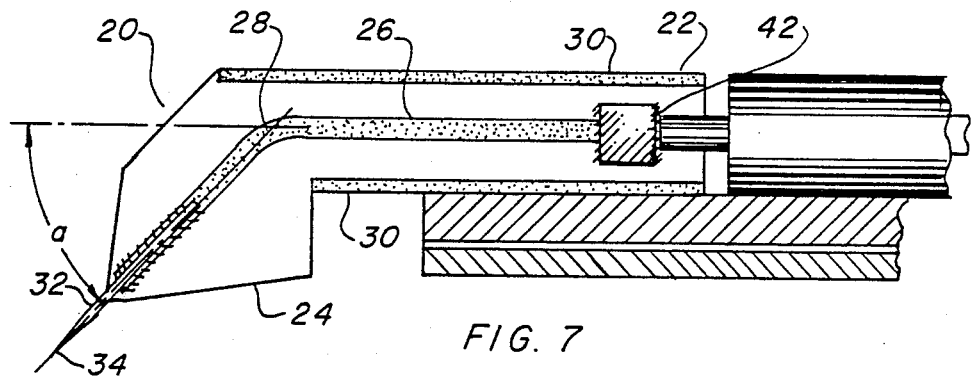
FIG. 7 is a side elevational view of the preferred embodiment with a coaxial cable attached to the blade.

The best mode for carrying out the invention is in terms of a preferred and a second embodiment. Both embodiments are primarily designed alike with only the addition of a duplicate needle probe in the second embodiment.

The preferred embodiment, as shown in FIGS. 1 through 3 and 6 through 9 is comprised of ceramic body 20 having a rectangular shank 22 on one end and an angular portion 24 on the other. The ceramic material may be any available type, however, alumina is preferred. The breadth of the body 20 is relatively thin from 0.010 inches (0.051 cm) to 0.030 inches (0.076 cm) with 0.020 inches (0.051 cm) being optimum for the standard 50 ohm impedance.

A microstrip 26 is positioned on the body 20 and is centrally located on the rectangular shank end 22. The microstrip is further oriented in a circular arc 28 on the angular portion 24 into an obtuse angle relative to the planar end. This obtuse angle is illustrated in FIG. 7 as alpha character "a". This angle is from 30 degrees to 60 degrees, depending upon the desired contact force required, with 45 degrees being preferred. The width of the microstrip 26 is equal to the thickness of the body 20 creating a controlled impedance. The testing equipment presently being employed in the industry is 50 ohms, which is achieved by a thickness of both the body 20 and microstrip 26 of 0.020 inches (0.051 cm). The microstrip 26 is metalized normally by screen printing or may either be deposited upon the surface of the body 20 by sputtering and etching or evaporating the metal. This material may be gold, copper, platinum-silver, or any other metal having the electrical conductivity necessary for the application.

The side of the body 20 opposite the microstrip 26 is completely covered with a metalized ground plane 30. This metalized surface 30 continues on the top and wraps slightly around to the microstrip side typically from 0.005 inches (0.013 cm) to "0.010 inches (0.26 cm). The rectangular shank area 22 of the body 20 along the bottom and again around to the microstrip side is similar to that of the top. The edges of the angular portion 24 of the body 20 with the exception of the top are free from any metalized ground plane 30. The configuration of the ground plane on the top and bottom edge and wrapping around slightly serve two purposes. First, a convenient flowpath is created for adding electrical devices from the grounded side to the microstrip 26. Secondly, the metalized surface offers a structurally sound attachment point to other equipment, such as a probe card with a substrate thereupon or an epoxy glass printed circuit board with an electrically conductive edge connector on one end. In these and other devices, a hole is usually located in the center and a plurality of probe blades are attached, by soldering, around the periphery of the hole. This edge metalized surface allows the solder to flow on both sides and adhere to the bottom achieving a high integrity bond. The ground plane 30 is metalized in the same manner using the same materials as that of the microstrip 26 previously discussed.

A straight needle 32 having a tapered end 34 with a spherical tip is attached to the microstrip 26 axially with the angular portion 24 near the termination of the circular arc 28. The needle 32 protrudes from the body 20 at the bottom of the angular portion 24 parallel with the microstrip 26 making an extension thereof in linear alignment. The needle is attached to the microstrip by soldering with a metal having a lower melting point than either the needle 32 or the microstrip 26. The needle 32 is made of any metal suitable for the application, such as tungsten, beryllium, copper, Paliney 7 alloy, or the like. The needle 32 is typically 0.010 inches (0.025 cm) in diameter in most applications, but may be sized from 0.006 inches (0.015 cm) up to 0.015 inches (0.037 cm) in diameter, depending upon the contact force requirement of the probe. The current normally applied to these probes has been effectively utilized in the range of 250 ma to 5.0 amps.

The configuration of the ground plane 30 on the body 20, as it wraps around to the stripline side, allows the use of a resistor 36 to be joined by soldering therebetween. This resistor 36 provides suppression of electrical spikes and minimizes transients and oscillations at these high frequencies encountered at power supply frequencies.

This same area may also be used to attach a chip capacitor 38. The suppression of electrical aberations is also achieved by this device and may be adapted, as required by the test set-up.

Figure 9:
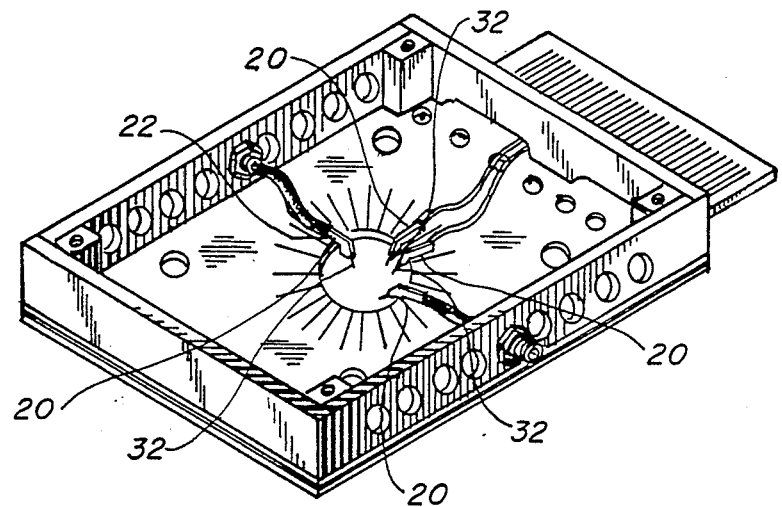
FIG. 9 is a partial isometric view of a typical application in a side access probe card.

The microstrip 26, as shown in FIG. 1, contains a small void 40 or space near the terminating point on the rectangular shank 22 of the body 20. This void 40 allows the use of a series resistor 42 depicted pictorially in FIG. 7. This is an optional feature that allows the resistors to be used when needed and when not required, the void 40 is simply covered with solder when the usual connection is made to the terminating conductor.

Where extremely high frequencies are required and minimum losses are at a premium, an edge launch threaded microwave connector 44 may be attached directly to the probe blade. A bifurcated ground element of the connector 44 interfaces with the ground plane 30 of the body 20 and the contact extending from the thermoplastic insulator of the connector is soldered directly to the microstrip 26. This embodiment is shown in FIG. 6 and may be used in conjunction with a probe card or printed circuit board, as illustrated in FIG. 9.

Figure 8:
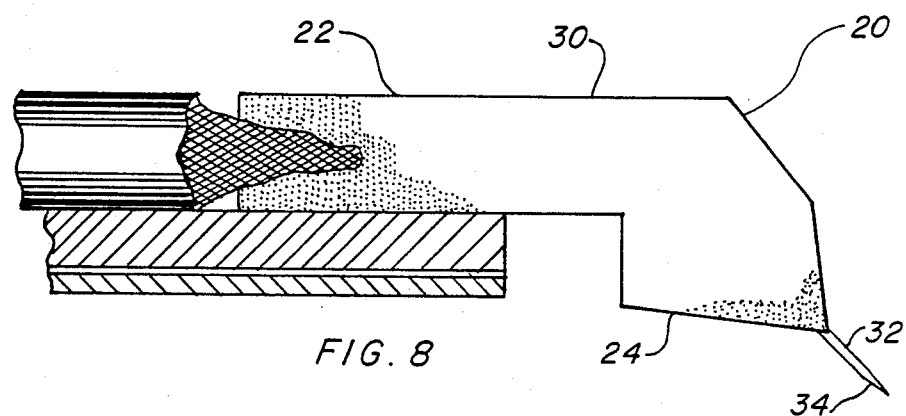
FIG. 8 is a view of the reverse side of the probe blade, as depicted in FIG. 7.

The connection of the probe blade to a conventional coaxial cable is provided by soldering the conductor directly to the microstrip 26 and isolating the shield to the ground plane 30 on the opposite side where a similar connection is made. This attachment is depicted in FIGS. 7 and 8 in side elevational views.

The second embodiment is illustrated in FIG. 4 and is identical to the first, except there are a pair of straight needles 32 employed. One of the needles 32 is attached to the microstrip 26, as before, and the other is juxtapositioned parallel to the first one on the metalized ground plane 30. Both needles protrude from the body an equal amount, such that mating pads on the microchip under test may be probed simultaneously. This ability allows an extremely short ground loop between the adjacent signal and ground pads allowing unrestricted testing at frequencies up to 10 gigahertz. Adjustment in width separation may be made by bending to accommodate the desired spacing with the hangout changed, if necessary, to maintain the planarity and spring contact.

While the invention has been described in complete detail and pictorially shown in the accompanying drawings, it is not to be limited to such details, since many changes and modifications may be in the invention without departing from the spirit and the scope thereof. Hence, it is described to cover any and all modifications and forms which may come within the language and scope of the appended claims.

I claim:

1. A high frequency ceramic microstrip probe blade comprising:
    (a) a ceramic body having a first and second side with a rectangular shank on one end and an angular portion on the other of relatively thin ceramic material;
    (b) a microstrip disposed planar with the first side centrally located upon the rectangular shank end and oriented in a circular arc on the angular portion into an obtuse angle relative to the planar portion, for conducting a high frequency signal at a specific impedance therewith;
    (c) a metalized ground plane covering the entire second side of the ceramic body opposite to the microstrip continuing around slightly to the first side on the rectangular shank end and on one edge of the angular portion providing an electrically conductive ground path therewith creating both a ground plane and a specific impedance to a high frequency signal; and,
    (d) a straight needle having a tapered end with a spherical tip attachingly disposed on a tangent with the microstrip on said angular portion of the body near the termination of the circular arc, said needle protruding therefrom parallel with said microstrip in such a manner as to interface with an electrical conductor, such as the test point pads on an integrated circuit wafer, a hybrid circuit or other small geometry microelectronic devices conducting high frequency signals, up to 10 gigahertz.

2. The probe blade as recited in claim 1 wherein the obtuse angle of said microstrip comprises angularity of from 210 degrees to 240 degrees relative to the planar portion.

3. The probe blade as recited in claim 1 wherein the width of the microstrip disposed on said ceramic body is equal to the thickness of the body creating a fixed impedance by virtue of their relationship.

4. The probe blade as recited in claim 3 further comprising; said fixed impedance is 50 ohms.

5. The probe blade as recited in claim 1 wherein said straight needle is attached to said microstrip by soldering with a metal having a lower melting point than either the needle or microstrip.

6. The probe blade as recited in claim 1 further comprising a resistor joined between said microstrip and said metalized ground plane on the angular portion of the body for minimizing electrical spikes, transients, and oscillations at power supply frequencies.

7. The probe blade as recited in claim 1 further comprising; a chip capacitor joined between said microstrip and said metalized ground plane on the angular portion of the body for minimizing electrical aberations on the test circuit.

8. The probe blade as recited in claim 1 further comprising; an edge launch threaded microwave connector affixed upon said microstrip on one side and said metalized ground plane on the other minimizing the flowpath for microwave signals from the needle tip to the connector for high frequency testing.

9. A high frequency ceramic microstrip probe blade comprising:
   (a) a ceramic body having a first and second side with a rectangular shank on one end and an angular portion on the other of relatively thin ceramic material;
   (b) a microstrip disposed planar with the first side centrally located upon the rectangular shank end and oriented in a circular arc on the angular portion into an obtuse angle relative to the planar portion, for conducting a high frequency signal at a specific impedance therewith;
   a metalized ground plane covering the entire second side of the ceramic body opposite to the microstrip continuing around slightly to the first side on the rectangular shank end and on one edge of the angular portion providing an electrically conductive ground path therewith creating both a ground plane and a specific impedance to a high frequency signal; and,
   (d) a pair of straight needles each having a tapered end with a spherical tip, one attached axially with the microstrip on said angular portion of the body and the other juxtapositioned parallel to the first on the metalized ground plane, both needles protruding from the body equidistant in such a manner as to interface with a pair of electrical conductors establishing a short ground loop between adjacent signal and ground pads, such as the test points on an integrated circuit wafer, a hybrid circuit or other small geometry microelectronic devices conducting high frequency signals up to 10 gigahertz.

10. The probe blade as recited in claim 9 wherein the obtuse angle of said microstrip comprises angularity of from 210 degrees to 240 degrees relative to the planar portion.

11. The probe blade as recited in claim 9 wherein the width of the microstrip disposed on said ceramic body is equal to the thickness of the body creating a fixed impedance by virtue of their relationship.

12. The probe blade as recited in claim 11 further comprising; said fixed impedance is 50 ohms.

13. The probe blade as recited in claim 9 wherein said straight needles are attached to said microstrip and ground plane by soldering with a metal having a lower melting point than either the needle or contiguous surface.

14. The probe blade as recited in claim 9 further comprising; a resistor joined between said microstrip and said metalized ground plane on the angular portion of the body for minimizing electrical spikes, transients, and oscillations at power supply frequencies.

15. The probe blade as recited in claim 9 further comprising; a chip capacitor joined between said microstrip and said metalized ground plane on the angular portion of the body for minimizing electrical aberations on the test circuit.

16. The probe blade as recited in claim 9 further comprising; an edge launch threaded microwave connector affixed upon said microstrip on one side and said metalized ground plane on the other minimizing the flowpath for microwave signals from the tips of each needle to the connector for high frequency testing.

* * * * *